United States Patent
Ogiso et al.

(10) Patent No.: US 6,727,034 B1
(45) Date of Patent: Apr. 27, 2004

(54) PHOTOSENSITIVE COMPOSITION AND USE THEREOF

(75) Inventors: Naohito Ogiso, Kyoto (JP); Tetsuya Watanabe, Kyoto (JP); Tetsuya Yamada, Kyoto (JP)

(73) Assignee: Sanyo Chemical Industries, Ltd., Kyoto (JP)

( * ) Notice: Subject to any disclaimer, the term of this patent is extended or adjusted under 35 U.S.C. 154(b) by 86 days.

(21) Appl. No.: 09/269,564

(22) PCT Filed: Oct. 2, 1997

(86) PCT No.: PCT/JP97/03522

§ 371 (c)(1),
(2), (4) Date: May 14, 1999

(87) PCT Pub. No.: WO98/14831

PCT Pub. Date: Apr. 9, 1998

(30) Foreign Application Priority Data

Oct. 2, 1996 (JP) .............................. 8-281786
Oct. 3, 1996 (JP) .............................. 8-283197
Jun. 23, 1997 (JP) .............................. 9-183026

(51) Int. Cl.[7] .......................... G03F 7/012; G03F 7/021
(52) U.S. Cl. .......................... 430/176; 430/25; 430/28; 430/196; 430/197
(58) Field of Search ................ 430/196, 197, 430/170, 176, 25, 28

(56) References Cited

U.S. PATENT DOCUMENTS

| | | | |
|---|---|---|---|
| 4,086,090 A | 4/1978 | Kohashi et al. | .............. 96/35.1 |
| 6,020,093 A | * 2/2000 | Shibuya et al. | ................ 430/7 |

FOREIGN PATENT DOCUMENTS

WO    WO98/49600    11/1998

OTHER PUBLICATIONS

Patent Abstracts of Japan vol. 011, No. 137, May 2, 1987 & JP 61 275838 A, Dec. 5, 1986.

* cited by examiner

*Primary Examiner*—John S. Chu
(74) *Attorney, Agent, or Firm*—Connolly Bove Lodge & Hutz LLP

(57) ABSTRACT

The present invention is related to a photosensitive composition which comprises 70 to 99 weight % of a vinyl polymer (A) comprising recurring units derived from a monomer (a) of the following general formula (1) and 1 to 30 weight % of at least one photosensitive compound (B) selected from the group consisting of azide compounds and diazo compounds.

$$H_2C=CH-X-Q \qquad (1)$$

[wherein X is selected from the group consisting of a direct bond, a 1,4-phenylene group, a sulfonyl group, a methylene group, and an alkylene group of 2 to 5 carbon atoms (the methylene and alkylene groups may respectively have one ether, carbonyl, carboxyl, amide or urea group); Q represents a functional group selected from the group consisting of $-NH-R$, $-COCH_2COCH_3$, and $-SO_2NH_2$; R represents a residue selected from the group consisting of $-CHO$, $-H$ (hydrogen), an alkyl group of 1 to 6 carbon atoms (the alkyl group may have one hydroxyl, ether, amino, nitro, cyano, carbonyl, carboxyl, amide, or urea group), $-NH_2$, $-N(CH_3)_2$, $-COOH$, $-CONH_2$ and $-CONHCH_3$].

20 Claims, No Drawings

PHOTOSENSITIVE COMPOSITION AND USE THEREOF

TECHNICAL FIELD

The present invention relates to a photosensitive composition having exceptionally high sensitivity and high resolution and to technologies for fabrication of a black matrix and phosphor screen for a color picture tube using the same.

BACKGROUND ART

Black matrices for a color picture tube are generally fabricated in accordance with the following procedure:
(1) coating a glass panel all over with a water-soluble photosensitive composition,
(2) exposing the coated panel to ultraviolet light through a photomask to insolubilize the exposed areas against water,
(3) removing the unexposed areas by water spray to form a resist pattern,
(4) applying a dispersion of a black substance such as graphite,
(5) decomposing the resist pattern with an oxidizing agent, and
(6) removing the decomposition product by water spray.

Since this process involves many steps and time-consuming, a shortening of the process, particularly of the UV exposure step which is rate-determining, has been required.

As photosensitive compositions for use in the process to resolve the problem,
(1) a photosensitive composition comprising a polyvinylpyrrolidone and a water-soluble azide compound (Japanese Kokai Publication Sho-48-79970),
(2) a photosensitive composition comprising an acrylamide-diacetoneacrylamide copolymer and a water-soluble azide compound (Japanese Kokai Publication Sho-50-33764), and
(3) a photosensitive composition comprising an acrylamide-diacetoneacrylamide-acryloylmorpholine copolymer and a water-soluble azide compound (Japanese Kokai Publication Hei-6-51509), among others, have heretofore been proposed.

Meanwhile, phosphor screens for a color picture tube are manufactured by subjecting a glass panel having a black matrix formed thereon to the following sequence of steps:
(1) coating the whole surface of the glass panel with three kinds of photosensitive compositions each comprising a suspension of one of three phosphors corresponding to the primaries of red, green and blue,
(2) exposing the coated surface to ultraviolet light through a photomask to insolubilize the exposed areas against water, and
(3) removing the unexposed areas by water spray, the above series of steps being carried out for each of the three primary phosphors, finally followed by heating the coated panel within the air to oxidatively decompose and remove the organic component.

However, because photosensitive compositions containing a noxious chromium compound are used, this conventional process has disadvantages that the operation and equipments for removing chromium from the waste liquor are required for protection of the environment and that because of the poor aging resistance of the photosensitive components, the so-called dark reaction proceeds gradually, for example during storage, even when the phosphor screen is not directly exposed to ultraviolet light. An additional problem is that chromium tends to remain in the phosphor pattern after said decomposition and removal of organic matter and cause coloration of the phosphor screen or interfere with emissions from the phosphors to reduce the luminance of the color picture tube. In view of those disadvantages, development of chromium-free photosensitive compositions has been needed.

As phosphor-containing photosensitive compositions for use in the process with a view to overcoming the above disadvantages, the followings have heretofore been proposed:
(4) a phosphor-containing photosensitive composition comprising a water-soluble polymer, such as polyacrylamide or polyvinylpyrrolidone, and a water-soluble azide compound (Japanese Kokai Publication Sho-49-43569),
(5) a phosphor-containing photosensitive composition comprising a water-soluble polymer, such as polyvinyl alcohol or polyvinylpyrrolidone, and a water-soluble diazo compound (Japanese Kokai Publication Sho-49-100955), and
(6) a phosphor-containing photosensitive composition comprising an aqueous solution of a water-soluble styrylpyridinium compound (Japanese Kokai Publication Sho-60-71682), among others.

However, all the above-mentioned photosensitive compositions (1) to (6) are not so sufficiently sensitive to low-illuminance levels of exposure light that if the illuminance drops in the course of manufacture of large-sized cathode-ray tubes or high-definition tubes, the exposure time will be considerably protracted to result in decrease in productivity. Moreover, an additional number of exposure units must be installed but this leads to disadvantages in respect of machine space, equipment maintenance, and cost of equipments.

Furthermore, in the case of the above-mentioned photosensitive compositions (4) to (6) for use in the fabrication of phosphor screens, the light-sensitive components are of poor aging resistance, which inavoidably results in degradation due to the dark reaction and moreover may cause troubles and loss of yield, during continuous use in a picture tube production line.

SUMMARY OF THE INVENTION

The inventors have made a thorough analysis of the above drawbacks and study for resolving these problems of known photosensitive compositions for a black matrix and phosphor screen of a color picture tube and have reached the present invention discovering that a photosensitive composition comprising a vinyl polymer comprising a recurring unit derived from a monomer containing a functional group having a frontier electron density of not less than 0.067 and an azide compound and/or diazo compound (B) provides for exceptionally high sensitivity leading to a drastic reduction in exposure time as well as high aging resistance. This, according to this invention, is provided a photosensitive composition comprising 70 to 99 weight % of a vinyl polymer (A) comprising recurring units derived from a monomer (a) of the following general formula (1) wherein the functional group represented by Q has a frontier electron density of not less than 0.067 as computed in accordance with the following equation and 1 to 30 weight % of at least one photosensitive compound (B) selected from the group consisting of azide compounds and diazo compounds.

(1)

[wherein X is selected from the group consisting of a direct bond, a 1,4-phenylene group, a sulfonyl group, a methylene group, and an alkylene group of 2 to 5 carbon atoms (said methylene and alkylene groups may respectively have one ether, carbonyl, carboxyl, amide or urea group). Q represents a functional group selected from the group consisting of —NH—R, —COCH$_2$COCH$_3$, and —SO$_2$NH$_2$. R represents a residue selected from the group consisting of —CHO, —H (hydrogen), alkyl of 1 to 6 carbon atoms (said alkyl may have one hydroxyl, ether, amino, nitro, cyano, carbonyl, carboxyl, amide, or urea group), —NH$_2$, —COOH, —CH$_2$CH$_2$OH, —CH$_2$CH$_2$NH$_2$, —CONH$_2$ and —CONHCH$_3$.]

Frontier electron density=2×(Atomic orbital coefficient in lowest unoccupied molecular orbital (LUMO))$^2$ In another aspect of the invention, is provided a photosensitive composition comprising 70 to 99 weight % of a vinyl polymer (A1) comprising recurring units derived from a monomer (a1) containing a functional group having a frontier electron density of not less than 0.067 and a solubility parameter of 8.6 to 11.0 and 1 to 30 weight % of at least one photosensitive compound (B) selected from the group consisting of azide compounds and diazo compounds.

The present invention further provides a photosensitive composition comprising 30 to 98 weight % of a photosensitive composition and 2 to 70 weight % of at least one water-soluble polymer (C), having a weight average molecular weight of not less than 1000, and being selected from the group consisting of vinylpyrrolidone polymers, (meth)acrylamide-diacetone(meth)acrylamide polymers, N,N-dimethylaminoethyl (meth)acrylate polymers, 3-sulfopropyl (meth)acrylate polymers inclusive of their salts, N,N-dimethylaminopropyl(meth)-acrylamide polymers, 2-(meth)acrylamide-2-methylpropanesulfonic acid polymers inclusive of their salts, and styrenesulfonic acid polymers inclusive of their salts.

In a further aspect, the present invention is concerned with technologies for fabricating black matrix and phosphor screen of a color picture tube using said photosensitive composition(s).

DETAILED DESCRIPTION OF THE INVENTION

The present invention is now described in detail.

The photosensitive composition of the present invention comprises said vinyl polymer (A) comprising recurring units derived from monomer (a) and said photosensitive compound (B).

Referring to the above general formula (1), X is preferably a direct bond.

Further in general formula (1), R is preferably —CHO, —H, —CH$_3$, —C$_2$H$_5$, —CH$_2$CH$_2$CH$_3$, —CH(CH$_3$)$_2$, —NH$_2$, —COOH, —CH$_2$CH$_2$OH, —CH$_2$CH$_2$NH$_2$, —CONH$_2$ or —CONHCH$_3$. The more preferred is —CHO.

Referring, further, to the above general formula (1), the frontier electron density of the functional group represented by Q therein is not less than 0.067.

The frontier electron density (hereinafter referred to briefly as fr) is a quantity computed from the electron density of frontier orbital of a molecule, and it is known that the higher the value of fr is, the more reactive is the molecule [e.g. Fukui et al., J. Chem. Phys., 20, 722 (1952) and Fukui et al., J. Chem. Phys., 22, 1433 (1954)].

The equation for computation of the above fr depends on the mode of reaction. In the case of the photosensitive composition of the present invention, said photosensitive compound (B) is irradiated to generate an active species, which removes a hydrogen atom from a specific site of said polymer (A) or (A1) to thereby give rise to a new active species which, in turn, induces various crosslinking and other reactions leading to insolubilization against a developer solvent.

In this case, fr is found by squaring the Atomic orbital coefficient in lowest unoccupied molecular orbital (abbreviated hereinafter as LUMO) and multiplying the product by 2. For identification of the site of reaction, the intramolecular hydrogen atoms only may be taken into consideration.

Thus, a polymer containing a functional group having a large value of fr is so fast in removing hydrogen as to result in increased crosslinking reaction rate and high sensitivity of the photosensitive composition.

Regarding the molecular structure for computation of fr in the present invention, the computation was carried out with respect to compounds having each functional group linked to a 2-butyl group, as model compounds for said vinyl polymers. For example, when the functional group was —NHCHO, the computation of fr was performed for the following:

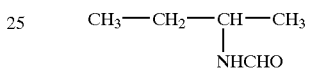

As the computation software, MOPAC 93-PM3 (Parametric Method 3) was used. The computation flow was as follows.
(1) Using the PM3 method, is performed a structural optimization for the subject compound.
(2) The LUMO of the optimized structure is determined.
(3) The atomic orbital coefficient of each hydrogen atom in the LUMO is squared, followed by multiplying the product by 2 to obtain fr for the corresponding hydrogen atom.
(4) Of the fr values thus computed for the hydrogen atoms, the largest value is taken as the fr of the functional group.

The fr values computed by the above method for the functional groups represented by Q, for instance, are as follows.

—NH$_2$ (fr=0.2667), —NHCH$_3$ (fr=0.1958), —NHCH(CH$_3$)$_2$ (fr=0.1689), —NHC$_2$H$_5$ (fr=0.1611), —NHCH$_2$CH$_2$CH$_3$ (fr=0.1473), —NHNH$_2$ (fr=0.1468), —NHCH$_2$CH$_2$OH (fr=0.1370), —NHCOOH (fr=0.1213), —NHCH$_2$CH$_2$NH$_2$ (fr=0.1157), —NHN(CH$_3$)$_2$ (fr=0.0946), —NHCONH$_2$ (fr=0.0730), —COCH$_2$COCH$_3$ (fr=0.0729), —SO$_2$NH$_2$ (fr=0.0707), —NHCONHCH$_3$ (fr=0.0685), and —NHCHO (fr=0.0676).

A polymer having a functional group with a fr not less than 0.067 is so fast in removing hydrogen, that the rate of crosslinking reaction is high and, hence, the sensitivity of the photosensitive composition is very high.

It is only sufficient that, in the vinyl polymer (A) mentioned above, the functional group represented by Q exists within the molecule of the vinyl polymer (A), and may have been introduced by polymerizing a vinyl monomer (a) containing said functional group within its molecule or by way of a polymer modification reaction to a vinyl polymer. Incidentally, it should be understood that the term "polymer" as used in this specification includes both a homopolymer and a copolymer unless otherwise indicated.

Some typical preparation methods for various species of said vinyl polymer (A) usable in the composition of the present invention are described below.

[1] X represents a direct bond:

(1) In the case of Q representing —NHCHO
The polymer is obtainable by polymerizing commercially available N-vinylformamide.

(2) In the case of Q representing —NH$_2$
The polymer is obtainable by hydrolyzing the polyvinylformamide obtained in the above (1) with sodium hydroxide.

(3) In the case of Q representing —NHCH$_3$
The polymer is obtainable by reacting the polyvinylamine obtained in the above (2) with methyl iodide.

(4) In the case of Q representing —NHC$_2$H$_5$
The polymer is obtainable by reacting the polyvinylamine obtained in the above (2) with ethyl iodide.

(5) In the case of Q representing —NHCH$_2$CH$_2$CH$_3$
The polymer is obtainable by reacting the polyvinylamine obtained in the above (2) with n-propyl bromide.

(6) In the case of Q representing —NHCH(CH$_3$)$_2$
The polymer is obtainable by reacting the polyvinylamine obtained in the above (2) with isopropyl bromide.

(7) In the case of Q representing —NHNH$_2$
The polymer is obtainable by treating the polyvinylamine obtained in the above (2) with gelatin in an aqueous solution of chloramine.

(8) In the case of Q representing —NHCOOH
The polymer is obtainable by oxidizing the polyvinylformamide obtained in the above (1) with chromic acid in the presence of acetic acid.

(9) In the case of Q representing —NHCH$_2$CH$_2$OH
The polymer is obtainable by reacting the polyvinylamine obtained in the above (2) with ethylene oxide.

(10) In the case of Q representing —NHCH$_2$CH$_2$NH$_2$
The polymer is obtainable by reacting the polyvinylamine obtained in the above (2) with ethyleneimine.

(11) In the case of Q representing —NHCONH$_2$
The polymer is obtainable by reacting the polymer obtained in the above (8) with urea.

(12) In the case of Q representing —NHCONHCH$_3$
The polymer is obtainable by reacting the polymer obtained in the above (11) with methyl iodide.

(13) In the case of Q representing —SO$_2$NH$_2$
The polymer is obtainable by reacting thionyl chloride with vinylsulfonic acid, followed by treating the reaction product with ammonia and polymerizing the resulting vinylsulfonamide.

(14) In the case of Q representing —COCH$_2$COCH$_3$
The polymer is obtainable by reacting vinyl methyl ketone with mixed acid anhydride derived from acetic acid and p-toluenesulfonic acid in the presence of sodium methoxide and polymerizing the resulting compound.

[2] X represents 1,4-phenylene (1) In the case of Q representing —NH$_2$
The polymer is obtainable by polymerizing 4-aminostyrene.

(2) In the case of Q representing —NHCHO
The polymer is obtainable by reacting dimethylformamide with the polymer obtained in the above (1).

(3) In the case of Q representing —NHCH$_3$
The polymer is obtainable by reacting the polymer obtained in the above (1) with methyl iodide.

(4) In the case of Q representing —NHC$_2$H$_5$
The polymer is obtainable by reacting the polymer obtained in the above (1) with ethyl iodide.

(5) In the case of Q representing —NHCH$_2$CH$_2$CH$_3$
The polymer is obtainable by reacting the polymer obtained in the above (1) with n-propyl bromide.

(6) In the case of Q representing —NHCH(CH$_3$)$_2$
The polymer is obtainable by reacting the polymer obtained in the above (1) with isopropyl bromide.

(7) In the case of Q representing —NHNH$_2$
The polymer is obtainable by treating the polymer obtained in the above (1) with gelatin in an aqueous solution of chloramine.

(8) In the case of Q representing —NHCOOH
The polymer is obtainable by oxidizing the polymer obtained in the above (1) with chromic acid in the presence of acetic acid.

(9) In the case of Q representing —NHCH$_2$CH$_2$OH
The polymer is obtainable by reacting the polymer obtained in the above (1) with ethylene oxide.

(10) In the case of Q representing —NHCH$_2$CH$_2$NH$_2$
The polymer is obtainable by reacting the polymer obtained in the above (1) with ethyleneimine.

(11) In the case of Q representing —NHCONH$_2$
The polymer is obtainable by reacting the polymer obtained in the above (8) with urea.

(12) In the case of Q representing —NHCONHCH$_3$
The polymer is obtainable by reacting the polymer obtained in the above (11) with methyl iodide.

(13) In the case of Q representing —SO$_2$NH$_2$
The polymer is obtainable by reacting thionyl chloride with p-styrenesulfonic acid, treating the reaction product with ammonia and polymerizing the resulting p-styrenesulfonamide.

(14) In the case of Q representing —COCH$_2$COCH$_3$
The polymer is obtainable by reacting p-vinylacetophenone with mixed acid anhydride derived from acetic acid and p-toluenesulfonic acid in the presence of sodium methoxide and polymerizing the resulting compound.

[3] X represents —(CH$_2$)$_n$—

(1) In the case of Q representing —NH$_2$
The polymer is obtainable by polymerizing CH$_2$=CH—(CH$_2$)$_n$—NH$_2$ (n=1 to 5).

(2) In the case of Q representing —NHCHO, —NHCH$_3$, —NHC$_2$H$_5$, —NHCH$_2$CH$_2$CH$_3$, —NHCH(CH$_3$)$_2$, —NHNH$_2$, —NHCOOH, —NHCH$_2$CH$_2$OH, —NHCH$_2$CH$_2$NH$_2$, —NHCONH$_2$ or —NHCONHCH$_3$
Each polymer is obtainable in the same manner as defined in the above [2].

(3) In the case of Q representing —SO$_2$NH$_2$
The polymer can be provided by reacting thionyl chloride with H$_2$C=CH—(CH$_2$)$_n$—SO$_3$H (n=1 to 5), treating the reaction product with ammonia, and polymerizing the resulting vinylalkyl sulfonamide.

(4) In the case of Q representing —COCH$_2$COCH$_3$
The polymer is obtainable by reacting H$_2$C=CH—(CH$_2$)$_n$—COCH$_3$ (n=1 to 5) with mixed acid anhydride comprising acetic acid and p-toluenesulfonic acid in the presence of sodium methoxide and polymerizing the resulting compound.

[4] X represents —O—(CH$_2$)$_n$—

(1) In the case of Q representing —NH$_2$
The polymer is obtainable by reacting a polyvinyl alcohol derivative with Br—(CH$_2$)$_n$—NH$_2$ (n=1 to 5) in the presence of a base.

(2) In the cases of Q representing —NHCHO, —NHCH$_3$, —NHC$_2$H$_5$, —NHCH$_2$CH$_2$CH$_3$, —NHCH(CH$_3$)$_2$, —NHNH$_2$, —NHCOOH, —NHCH$_2$CH$_2$OH, —NHCH$_2$CH$_2$NH$_2$, —NHCONH$_2$ or —NHCONHCH$_3$
Each polymer is obtainable by the same corresponding method as described in [2].

(3) In the case of Q representing —SO$_2$NH$_2$
The polymer is obtainable by reacting a polyvinyl alcohol derivative with Br—(CH$_2$)$_n$—SO$_3$H (n=1 to 5) in the presence of a base, reacting thionyl chloride with the reaction product, and treating the resulting compound with ammonia.

(4) In the case of Q representing —COCH$_2$COCH$_3$

The polymer is obtainable by reacting a polyvinyl alcohol derivative with Br(CH$_2$)$_n$—COCH$_3$ (n=1 to 5) in the presence of a base and reacting the resulting compound with mixed acid anhydride comprising acetic acid and p-toluenesulfonic acid in the presence of sodium methoxide.

[5] X represents —COO—(CH$_2$)$_n$—

(1) In the case of Q representing —NH$_2$

The polymer is obtainable by esterifying OH—(CH$_2$)n—NH$_2$ (n=1 to 5) with acrylic acid and polymerizing the resulting ester.

(2) In the cases of Q representing —NHCHO, —NHCH$_3$, —NHC$_2$H$_5$, —NHCH$_2$CH$_2$CH$_3$, —NHCH(CH$_3$)$_2$, —NHNH$_2$, —NHCOOH, —NHCH$_2$CH$_2$OH, —NHCH$_2$CH$_2$NH$_2$, —NHCONH$_2$ or —NHCONHCH$_3$ Each polymer is obtainable by the same corresponding method as described in the above [2].

(3) In the case of Q representing —SO$_2$NH$_2$

The polymer is obtainable by esterifying OH—(CH$_2$)n—SO$_3$H (n=1 to 5) with acrylic acid, reacting thionyl chloride with the resulting ester, treating the reaction product with ammonia, and polymerizing the resulting sulfonamide derivative.

(4) In the case of Q representing —COCH$_2$COCH$_3$

The polymer is obtainable by esterifying OH—(CH$_2$)n—COCH$_3$ (n=1 to 5) with acrylic acid, reacting the resulting ester with mixed acid anhydride comprising acetic acid and p-toluenesulfonic acid in the presence of sodium methoxide, and polymerizing the resulting compound.

[6] X represents —OCO—(CH$_2$)$_n$—

(1) In the case of Q representing —NH$_2$

The polymer is obtainable by esterifying a polyvinyl alcohol derivative with HOOC—(CH$_2$)$_n$—NH$_2$ (n=1 to 5).

(2) In the cases of Q representing —NHCHO, —NHCH$_3$, —NHC$_2$H$_5$, —NHCH$_2$CH$_2$CH$_3$, —NHCH(CH$_3$)$_2$, —NHNH$_2$, —NHCOOH, —NHCH$_2$CH$_2$OH, —NHCH$_2$CH$_2$NH$_2$, —NHCONH$_2$ or —NHCONHCH$_3$ Each polymer is obtainable by the same corresponding method as described in the above [2].

(3) In the case of Q representing —SO$_2$NH$_2$

The polymer is obtainable by esterifying a polyvinyl alcohol derivative with HOOC—(CH$_2$)$_n$—SO$_3$H (n=1 to 5), reacting thionyl chloride with the resulting ester compound, and treating the reaction product with ammonia.

(4) In the case of Q representing —COCH$_2$COCH$_3$

The polymer is obtainable by esterifying a polyvinyl alcohol derivative with HOOC—(CH$_2$)$_n$—COCH$_3$ (n=1 to 5) and reacting the resulting ester with mixed acid anhydride derived from acetic acid and p-toluenesulfonic acid in the presence of sodium methoxide.

[7] X represents —CONH—(CH$_2$)$_n$—

(1) In the case of Q representing —NH$_2$

The polymer is obtainable by reacting H$_2$N—(CH$_2$)$_n$—NH$_2$ (n=1 to 5) with acryloyl chloride and polymerizing the resulting compound.

(2) In the case of Q representing —NHCHO, —NHCH$_3$, —NHC$_2$H$_5$, —NHCH$_2$CH$_2$CH$_3$, —NHCH(CH$_3$)$_2$, —NHNH$_2$, —NHCOOH, —NHCH$_2$CH$_2$OH, —NHCH$_2$CH$_2$NH$_2$, —NHCONH$_2$ or —NHCONHCH$_3$ Each polymer can be prepared by the same corresponding method as described in the above [2].

(3) In the case of Q representing —SO$_2$NH$_2$

The polymer is obtainable by reacting H$_2$N—(CH$_2$)$_n$—SO$_3$H (n=1 to 5) with acryloyl chloride, reacting thionyl chloride with the reaction product, treating the resulting compound with ammonia, and polymerizing the resulting sulfonamide derivative.

(4) In the case of Q representing —COCH$_2$COCH$_3$

The polymer is obtainable by reacting H$_2$N—(CH$_2$)$_n$—COCH$_3$ (n=1 to 5) with acryloyl chloride, reacting the reaction product further with mixed acid anhydride derived from acetic acid and p-toluenesulfonic acid in the presence of sodium methoxide, and polymerizing the resulting compound.

In the present invention, a vinyl polymer (A1) comprising a recurring unit derived from a monomer (a1) having a functional group which has a frontier electron density of not less than 0.067 and a solubility parameter (hereinafter abbreviated as SP) of 8.6 to 11.0 can also be employed. This polymer is preferred because of its good balance between developer solvent resistance and responsiveness to etching.

If the SP of the functional group is less than 8.6, the responsiveness of the composition to etching may possibly be insufficient. If the SP exceeds 11.0, the solvent resistance may possibly be insufficient.

SP, mentioned above, is expressed as the square root of cohesive energy density ($\Delta E$)/molecular volume (V), thus $$SP^2 = \Delta E/V$$

SP is an indicator of the solubility of an individual substance. The closer the SP values of two substances to each other, the higher is the compatibility of the substances.

The method for calculation of SP is detailed in literatures [e.g. R. F. Fedors, Polymer Engineering and Science, 14 (2), 147 (1974)].

Regarding the molecular structure for use in the computation of SP in the invention, compounds having each functional group linked to a 2-butyl group were used as model compounds for vinyl polymers, in the same manner as in the computation of fr.

The SP values and fr values of functional groups as computed using the above methods are as follows.

—NHNH$_2$ (SP=9.35, fr=0.1468), —NHCH$_2$CH$_2$OH (SP=11.05, fr=0.1370), —NHCOOH (SP=10.24, fr=0.1213), —NHCH$_2$CH$_2$NH$_2$ (SP=9.17, fr=0.1157), —NHCONH$_2$ (SP=11.70, fr=0.0730), —COCH$_2$COCH$_3$ (SP=9.84, fr=0.0729), —NHCONHCH$_3$ (SP=10.13, fr=0.0685), —NHCHO (SP=10.21, fr=0.0676).

The functional groups of said monomer (a1) are not restricted to these, but may be any groups having an SP value of which is within the range of 8.6 to 11.0 among the functional groups represented by Q in said general formula (1).

The monomer (a1) is not particularly restricted as far as it is a monomer containing a functional group having a frontier electron density of not less than 0.067 and an SP value of 8.6 to 11.0, thus including, for example, those monomers having an SP value within the range of 8.6 to 11.0, among the species of the monomer (a) of general formula (1).

In the present invention, N-vinylformamide is preferred among the above monomers (a) and (a1).

The vinyl polymer (A) or (A1), as far as it has any of said functional groups within its molecule, may be a homopolymer or a copolymer with another vinyl monomer.

When the above vinyl polymer (A) or (A1) is a copolymer, the other vinyl monomer is not particularly restricted as far as it is a copolymerizable monomer containing a vinyl group and compatible with said monomer (a) or (a1) having said functional group in the polymerization system, and may be water-soluble or insoluble.

Water-soluble vinyl monomers (b) includes, for example,

① unsaturated carboxylic acids (and salts)
    (meth)acrylic acids, crotonic acid, itaconic acid (anhydride), maleic acid (anhydride), fumaric acid, etc. and their salts (amine salts, alkali metal salts, etc.), etc.;

② hydroxy- or alkoxy-containing (meth)acrylic esters
    2-hydroxyethyl(meth)acrylates, 2-hydroxypropyl (meth)acrylates, glycerol monomethacrylate, 2-ethoxyethyl (meth)acrylates, carbitol (meth)acrylates, polyethylene glycol mono(meth)acrylates, etc.;

③ unsaturated amides and their derivatives
    (meth)acrylamides, diacetone(meth)acrylamides, N-methyl(meth)acrylamides, N-ethyl(meth)acrylamides, N-isopropyl(meth)acrylamides, N,N-dimethyl(meth)acrylamides, N,N-diethyl(meth)acrylamides, N-methylol(meth)acrylamides, N-methoxymethyl(meth)acrylamides, N-ethoxymethyl-(meth)acrylamides, N-butoxymethyl(meth)acrylamides, N,N-dialkylaminoethyl(meth)acrylamides, N,N-dialkylaminopropyl(meth)acrylamides, etc.;

④ sulfonic acid (salt) group-containing monomers
    styrenesulfonic acid, 3-sulfopropyl(meth)acrylates, 2-(meth)acrylamido-2-methylpropanesulfonic acids, etc. and their salts (amine salts, alkali metal salts, etc.), etc.;

⑤ phosphoric acid (salt) group-containing monomers
    [2-(methacryloyloxy)ethyl] phosphate or its salts (amine salts, alkali metal salts, etc.), etc.;

⑥ tertiary amine (salt) group- or quaternary ammonium salt group-containing monomers
    N,N-dimethylaminoethyl(meth)acrylates, N,N-diethylaminoethyl(meth)acrylates, their salts with acids (inorganic acids or organic acids), [2-(methacryloyloxy)-ethyl]trimethylammonium chloride, etc.; and ⑦ heterocycle-containing monomers N-(meth)acryloylmorpholine, vinylimidazole, vinylpyridine, N-vinylpyrrolidone, etc.

Water-insoluble vinyl monomers include, for example,

① nitrile monomers
    (meth)acrylonitriles, etc.;

② aliphatic unsaturated hydrocarbons
    α-olefins, isoprene, butadiene, etc.;

③ styrenic monomers
    styrene, α-methylstyrene, p-methoxystyrene, vinyltoluene, p-hydroxystyrene, p-acetoxystyrene, etc.;

④ alkyl(meth)acrylates of 1 to 18 carbon atoms
    methyl(meth)acrylates, ethyl(meth)acrylates, butyl (meth)acrylate, 2-ethylhexyl(meth)acrylates, lauryl (meth)acrylates, stearyl(meth)acrylates, etc.;

⑤ vinyl ester monomers
    vinyl acetate, vinyl propionate, etc.; and

⑥ vinyl ether monomers
    vinyl ethyl ether, vinyl isobutyl ether, etc.

The other vinyl monomer mentioned above may be used alone of monomer or in a combination of two or more monomers.

In copolymers with the above-mentioned other vinyl monomer, the proportion of the recurring units derived from monomer (a) or (a1) is preferably not less than 5 mole %, more preferably not less than 10 mole %. If its proportion is less than 5 mole %, no sufficient improvement in sensitivity may be obtained under some circumstances.

The polymers (A) or (A1) may be whichever of being water-soluble or water-insoluble. Preferred are water-soluble polymers for using in the fabrication of black matrix or phosphor screen of a color picture tube. More preferred are water-soluble copolymers with a water-soluble vinyl monomer (b).

The weight average molecular weight of said polymer (A) or (A1) is preferably 50,000 to 2,000,000, more preferably 200,000 to 1,500,000. If it is less than 50,000, the sensitivity-improving effect may not be sufficient. If 2,000,000 is exceeded, the viscosity may increase and unevenness of the film in the coating process may possibly be caused.

In applying the photosensitive composition of the present invention to fabrication of a black matrix for color picture tube, it is preferable that said composition has reciprocity law failing characteristics.

Reciprocity law failing characteristics are properties of a composition to form a stripe or dot pattern which is substantially smaller than the irradiated area of the glass surface in the presence of oxygen gas.

Detailed discussions on reciprocity law failing can be found in Japanese Kokai Publication Sho-48-79970, Poly. Eng. Sci., 17 (6), 353 (1977) and other literatures.

By using a photosensitive composition having a reciprocity law failing characteristic in the formation of the black matrix for a color picture tube, a black matrix having a smaller area than the mask area can be formed. When, using a panel formed with such a black matrix, green, blue and red phosphor patterns are successively formed, the area of the phosphor pattern is also substantially smaller than the mask area. Therefore, when a color picture tube is manufactured using this mask, the spot size of the electron beam incident through the slit or hole of the mask will be larger than the phosphor pattern so that the color picture tube will be bright and of high contrast.

Thus, to manufacture a high-resolution, high-quality color picture tube, the black matrix is preferably formed using a photosensitive composition having said reciprocity law failing characteristics.

If the composition of the present invention has such a reciprocity law failing characteristics, (i) a copolymer of said monomer (a) or (a1) with another water-soluble vinyl monomer (b1) can be used as the polymer used for the composition of the invention.

As said water-soluble vinyl monomer (b1) other than the monomer (a) or (a1) having said functional group, in the above copolymer (i), the following compounds, among the above mentioned examples of said other water-soluble vinyl monomer (b), can be used with advantage.

① Aromatic ring-containing water-soluble monomers
    Styrenesulfonic acid or its salts, vinylbenzyltrimethylammonium hydroxide, etc.;

② Heterocycle-containing water-soluble monomers
    Vinylimidazole, vinylpyridines, N-vinylpyrrolidone, N-(meth)acryloylmorpholines, N-[(meth)acryloyloxy]-ethylmorpholines, etc.;

③ Acrylic water-soluble monomers with a molecular weight not less than 130
    Monomeric acrylamides such as diacetone(meth)acrylamides, N-butoxymethyl(meth)acrylamides, N,N-dimethylaminoethyl-(meth)acrylamides, N,N-diethylaminoethyl(meth)acrylamides, N,N-dialkylaminopropyl(meth)acrylamides, N-butoxydimethyl-(meth)acrylamides, etc.; monomeric acrylates such as diethylene glycol ethoxy acrylate, glycerol mono(meth)acrylates, 2-ethoxyethyl (meth)acrylates, 2-hydroxypropyl(meth)acrylates, polyethylene glycol mono(meth)acrylate, etc.; sulfonic acid (salt)-containing monomers such as 2-(meth)

acrylamido-2-methylpropanesulfonic acid and salts thereof, and 3-sulfopropyl (meth)acrylate and salts thereof, etc.; phosphoric acid (salt)-containing monomers such as [2-[(meth)acryloyloxy]ethyl] phosphates etc.; and quaternary ammonium salt-containing monomers such as [2-[(meth)acryloyloxy]ethyl] trimethylammonium chlorides etc.

In the case of the above copolymer (i), the copolymerization molar ratio of the monomer (a) or (a1) having said functional group to the water-soluble vinyl monomer (b1) is preferably 99:1 to 20:80, more preferably 95:5 to 30:70. If the proportion of the monomer (a) or (a1) exceeds 99 mole %, the reciprocity law failing characteristic may not be expressed. When it is less than 20 mole %, a sufficient improvement in sensitivity may not be obtained.

Furthermore, as a composition having reciprocity law failing characteristics in the present invention, there can be employed a composition (ii) obtainable by formulating another water-soluble polymer (C) having a weight average molecular weight of not less than 1000 with a photosensitive composition of the present invention which comprises 70 to 99 weight % of the vinyl polymer (A) or (A1) having said functional group and 1 to 30 weight % of the photosensitive compound (B).

The other water-soluble polymers (C) mentioned above include, for example, vinylpyrrolidone polymers, (meth)acrylamide-diacetone(meth)acrylamide polymer, N,N-dimethylaminoethyl (meth)acrylate polymer, 3-sulfopropyl (meth)acrylate polymers and salts thereof, N,N-dimethylaminopropyl(meth)acrylamide polymers, 2-(meth)acrylamide-2-methylpropanesulfonic acid polymers and salts thereof, and styrenesulfonic acid polymers or salts thereof. The above (c) can be used as a polymer blend with the vinyl polymer (A) or (A1).

In the photosensitive composition (ii) obtainable by formulating said other water-soluble polymer (C) having a weight average molecular weight of not less than 1000 with said photosensitive composition comprising said polymer (A) or (A1) having said functional group and said photosensitive compound (B), the formulating ratio of the combined amount of polymer (A) or (A1) and photosensitive compound (B) to the amount of the water-soluble polymer (C) is 30:70 to 98:2 by weight, preferably 50:50 to 95:5 by weight.

For said reciprocity law failing characteristic to be expressed, gaseous oxygen must be present in the vicinity of the azide compound and, to insure the presence, the coat film of the photosensitive composition must be oxygen-permeable. When said water-soluble vinyl monomer (b1) is contained as a structural unit of the copolymer (i) contained in the photosensitive composition or said water-soluble polymer (C) is contained as a component unit of the composition (ii), the intermolecular interaction is attenuated to enhance the permeability of the composition to oxygen gas, with the result that the photosensitive composition containing said units has the reciprocity law failing characteristics.

As the photosensitive compound (B) used in the composition of the present invention, there can be mentioned both azide compounds and diazo compounds.

The above azide compounds are not particularly restricted as far as they are capable of forming nitrene upon exposure to ultraviolet light and reacting with said polymer (A) or (A1). Preferred are aromatic bisazide compounds having two azide groups within the molecule. Illustrative example include water-soluble azide compounds such as 4,4'-diazidostilbene-2,2'-disulfonic acid, sodium 4,4'-diazidostilbene-2,2'-disulfonate, 4,4'-diazidobenzalacetophenone-2-sulfonic acid, sodium 4,4'-diazidobenzalacetophenone-2-sulfonate, 4,4'-diazidostilbene-α-carboxylic acid, sodium 4,4'-diazidostilbene-α-carboxylate, 1,5-penta-3-one-1,4-diethenyl-bis(azidobenzenesulfonic acid), 1,5-penta-3-one-1,4-diethenyl-bis(sodium azidobenzenesulfonate), 2,6-bis(4-azidobenzal-2-sulfonic acid)-cyclopentanone, 2,6-bis(sodium 4-azidobenzal-2-sulfonate)cyclopentanone, etc.; and water-insoluble azide compounds such as 2,6-bis(4,4'-diazidobenzal)-cyclohexanone, 2,6-bis(4,4'-diazidobenzal)-4-methylcyclohexanone, 4,4'-diazidostilbene-2,2'-bis[N,N-di(2-ethoxyethyl)sulfonamide], 1,3-bis(4'-azidocinnamylidene)-2-propanone, etc.

The above diazo compounds are not particularly restricted as far as they are capable of liberating a radical through denitrification on exposure to ultraviolet light and reacting with said polymer (A) or (A1). Prefered are aromatic diazo compounds containing two or more diazo groups within the molecule. Illustrative examples include benzidinetetrazonium chloride, 3,3'-dimethylbenzidinetetrazonium chloride, 3,3'-dimethoxybenzidinetetrazonium chloride, 4,4'-diaminodiphenyl-aminotetrazonium chloride, 3,3'-diethylbenzidinetetrazonium sulfate, diazodiphenylamine-formalin condensate, and their several salts (zinc chloride salts, p-toluenesulfonic acid salts, etc.).

The photosensitive compound (B) may be used above or as a mixture of two or more species.

Among these, azide compounds are preferred for the fabrication of the black matrix and phosphor screen for a color picture tube. More preferred are water-soluble azide compounds, particularly sodium 4,4'-diazidostilbene-2,2'-disulfonate.

In the photosensitive composition of the present invention, the polymer (A) or (A1) and the photosensitive compound (B) are formulated in a weight ratio of (A) or (A1) to (B) of 70:30 to 99:1, preferably 80:20 to 99:1. If the proportion of the photosensitive compound (B) exceeds 30 weight %, the sufficient adhesion to the glass surface may not be expected. If it is less than 1 weight %, the sufficient sensitivity may perhaps be attained.

The photosensitive composition of the present invention may contain a finely divided powder (D). The above fine powders (D) include, for example, ① phosphors [red phosphors such as $Y_2O_2S:Eu$, $Y_2O_3:Eu$, etc.; green phosphors such as ZnS:Cu, Al, ZnS:Au, Cu, Al, ZnS:Au, Al, etc.; and blue phosphors such as ZnS:Ag, Cl, ZnS:Ag, Al, etc.];

② metal oxides [magnesia, alumina, antimony oxides, titanium dioxide, white carbon, diatomaceous earth, iron oxide, etc.];

③ metal hydroxides [aluminum hydroxide, magnesium hydroxide, calcium hydroxide, iron hydroxide, metatitanic acid, etc.];

④ metal salts [e.g. silicates such as kaolin, aluminum silicate, clay, talc, mica, asbesto powder, calcium silicate, cericite, bentonite, etc.; carbonates such as calcium carbonate, magnesium carbonate, barium carbonate, dolomite, etc.; sulfates such as calcium sulfate, barium sulfate, etc.];

⑤ pigments [indicated in the color index numbers below; black pigments such as C. I. Pigment Black 1, 6, 7, 9, 10, 11, etc.; red pigments such as C. I. Pigment Red 48, 97, 101, 102, 104, 105, 106, 122, 123, 144, 149, 166, 168, 177, 178, 180, 187, 190, 192, 208, etc.; green pigments such as C. I. Pigment Green 7, 36, etc.; blue pigments such as C. I. Pigment Blue 15, 22, 60, 64, etc.; yellow pigments such as C. I. Pigment Yellow 10, 17, 24, 34, 35, 42, 48, 83, 86, 93, 94, 108, etc.; violet pigments such as C. I. Pigment Violet 19, 23, 29, 30, 32, 37, 40, 50, etc.; orange pigments such as C. I. Pigment Orange 13, 36, 43, 51, 55, 59, 61, 64, 65, etc.; and white pigments such as C. I. Pigment White 1, 2, 3, 4, 5, 6, 7, 10, 18, 19, 22, 24, 25, 26, 27, etc.]. Preferred are phosphors.

The mean particle diameter of said finely divided powder (D), which may vary dependent on the kind of powder, is generally not greater than 1 mm, preferably 0.01 to 100 μm.

The formulating amount of said finely divided powder (D) in the finely divided powder-containing photosensitive composition, in terms of the weight ratio of the total of (A) or (A1) and (B):(D) or the weight ratio of the total (A) or (A1), (B) and (C):(D) in the case of containing (C) is preferably 0.5:99.5 to 60:40. It is preferred to formulate the respective components in a weight ratio of (A) or (A1):(B):(D) is (0.5 to 50):(0.002 to 20):(99.5 to 40). When the composition further contains (C), preferable weight ratio of (A) or (A1):(B):(C):(D) is (0.2 to 49):(0.0006 to 19):(0.003 to 60):(99 to 15).

The above finely divided powder-containing photosensitive composition preferably contains a dispersant (E) to disperse of (D) uniformly within the composition. The dispersant (E) is not particularly restricted as far as it has a dispersing action and is compatible with the other components. There may be mentioned anionic dispersants, nonionic dispersants and cationic dispersants.

Anionic dispersants include, for example,
① polycarboxylic acid (salt) dispersants [e.g. polyacrylic acid, isobutylene-maleic acid copolymers, styrene-maleic acid copolymers and their salts (amine salts, alkali metal salts, etc.)]; and
② sulfonic acid (salt) dispersants [e.g. dioctyl sulfosuccinate (amine salts, alkali metal salts, etc.), naphthalenesulfonic acid-formaldehyde condensate, etc.].

Nonionic dispersants include, for example,
① alkylene oxide adduct dispersants [e.g. polyoxyalkylene alkyl ethers, polyoxyalkylene higher fatty acid esters, polyoxyalkylene polyhydric alcohol higher fatty acid esters, polyoxyalkylene alkylphenyl ethers, polyoxyalkylene alkylamino ethers, higher fatty acid dialkanolamides, polyoxyethylene/polyoxypropylene block copolymers, etc.] and
② polyhydric alcohol dispersants [e.g. a polyhydric alcohol fatty acid ester and its alkylene oxide adducts, a polyhydric alcohol alkyl ether and its alkylene oxide adducts, etc.].

Cationic dispersants include, for example,
① amine dispersants [e.g. N,N-dialkylaminoethyl (meth)acrylate polymers neutralized with an inorganic or organic acid (formic acid, acetic acid, lactic acid, etc.) etc.] and
② quaternary ammonium dispersants [e.g. tetralkylammonium halides, quaternized N,N-dialkylaminoethyl (meth)acrylate polymers, etc.].

Among them, preferred are anionic and nonionic dispersants, particularly polyacrylic acid or its salts, isobutylene-maleic acid copolymer or its salts, styrene-maleic acid copolymer or its salts, polyoxyethylene/polyoxypropylene block copolymer, sorbitan fatty acid ester-ethylene oxide adducts and quaternary ammonium salts unsaturated acid.

In using the dispersant (E), the amount of (E) is preferably 0.01 to 10 weight %, more preferably 0.05 to 5 weight %, based on the weight of said finely divided powder (D). If the amount of (E) is less than 0.01 weight %, a sufficient dispersion stabilizing effect may not be obtained under some circumstances. If 10 weight % is exceeded, there are cases in which sensitivity and developability will be sacrificed.

The photosensitive composition of the present invention may contain a water-soluble or water-insoluble solvent or a mixture of such solvents as a diluent. By incorporating a diluent, it becomes possible to control the spreadability, shelf-stability, developing characteristic, adhesion and other properties of the composition of the present invention can be controlled.

Solvents are not particularly restricted as far as compatible with the respective components; and include water-soluble solvents, for example, water, alcohol type solvents such as methanol, ethanol, isopropyl alcohol, etc.; cellosolve type solvents such as methylcellosolve, ethylcellosolve, butylcellosolve, etc.; glycol type solvents such as diethylene glycol monomethyl ether, diethylene glycol monoethyl ether, etc.; and amide type solvents such as N-methylpyrrolidone, 2-pyrrolidone, N,N-dimethylformamide, N,N-dimethylacetamide, etc.

As water-insoluble solvents, there can be mentioned, for instance, an aliphatic hydrocarbon type solvents such as pentane, hexane, cyclohexane, etc.; aromatic hydrocarbon type solvents such as benzene, toluene, xylene, etc.; ester type solvents such as ethyl acetate, butyl acetate, ethyl lactate, ethyl-3-ethoxypropionate, etc.; a glycol type solvents such as ethylene glycol monoethyl ether, ethylene glycol monoethyl ether acetate, propylene glycol monomethyl ether acetate, etc.; and a halogen-containing hydrocarbon type solvents such as 1,1,1-trichloroethane, trichloroethylene, and tetrachloroethylene.

Among those diluents, water-soluble solvents are preferred and water is more preferred for the fabrication of the black matrix and phosphor screen for a color picture tube.

The diluent content can be freely selected according to coating conditions, etc. of the photosensitive composition. In case without fine powder (D), it is preferred to contain the diluent in an amount of 50 to 98 weight % within 100 weight % of the photosensitive composition. When fine powder (D) is contained, it is preferred to contain the diluent in an amount of 40 to 95 weight % within 100 weight % of the photosensitive composition.

The composition of the present invention may be optionally supplemented with another polymer with an average molecular weight of not less than 1,000. The spreadability, sensitivity, development characteristic, adhesion and other properties can be controlled by adding such other polymer.

The above other polymers mentioned are not particularly restricted and inclusive of poly(meth)acrylamides or (meth)acrylamide copolymers, polyvinyl alcohol or vinyl alcohol copolymers, styrylpyridinium salt compounds as described in Japanese Kokai Publication Sho-55-23163, poly(meth)acrylic acids or (meth)acrylic acid copolymers, casein, gelatin, methylcellulose, hydroxypropylcellulose, polyvinylcellulose, and polyethylene glycol.

When such other polymer is added, its addition amount can be liberally selected but is generally not greater than 50 weight %, preferably not greater than 30 weight %, based on the weight of the polymer (A) or (A1). If the amount exceeds 50 weight %, there may be cases in which sensitivity is sacrificed.

The composition of the present invention may be optionally supplemented with a hydroxyl and/or iodine-containing low molecular compound having a molecular weight of not greater than 990. By adding this low molecular compound, it becomes possible to adjust development characteristic and adhesion, etc. and to improve sensitivity.

Low molecular compounds having a hydroxyl group within the molecule include, for example, n-butanol, ethylene glycol, diethylene glycol, propylene glycol, 1,3-butylene glycol, 1,5-pentanediol, triethanolamine, glycerol, erythritol, pentaerythritol, sorbitol and hexitol.

Iodine-containing low molecular compounds include, for example, iodoacetic acid, 3,5-diamino-2,4,6-triiodobenzoic acid, sodium 3,5-diamino-2,4,6-triiodobenzoate, 3-amino-2,4,6-triiodobenzoic acid, sodium 3-amino-2,4,6-triiodobenzoate, 5-amino-2,4,6-triiodoisophthalic acid, sodium 5-amino-2,4,6-triiodoisophthalate, 5-amino-2,4,6-triiodoisophthalamic acid, sodium 5-amino-2,4,6-triiodoisophthalamide, 3,5-diiodosalicylic acid, sodium 3,5-diiodosalicylate, 2,3,5-triiodobenzoic acid, sodium 2,3,5-triiodobenzoate, tetraalkyl-ammonium iodide, sodium iodide and potassium iodide.

When said low molecular compound having a hydroxyl group and/or an iodine atom within the molecule is used, its amount is generally 1 to 200 weight %, preferably 1 to 100 weight %, based on the weight of the polymer (A) or (A1).

If the amount is less than 1 weight %, no sufficient effect of addition may be obtained. If 200 weight % is exceeded, development characteristic and resolution may tend to deteriorate.

For improved wettability with respect to the substrate, the composition of the invention may be supplemented with a surfactant as needed. Surfactants are not particularly restricted as far as compatible with the components of the composition, and include, for example, anionic surfactants, nonionic surfactants and cationic surfactants. Preferred are nonionic surfactants (e.g. sorbitan ester-ethylene oxide adducts, alkylphenol-ethylene oxide adducts, etc.).

When said surfactant is added, its addition amount is generally not over 5 weight %, preferably 0.05 to 3 weight %, based on the weight of the polymer (A) or (A1).

The composition of the present invention may be optionally supplemented with an adhesion promoter. The above adhesion promoter can be mentioned silane coupling agents, titanium coupling agents, organic carboxylic acid compounds, organophosphoric acid compounds, and organophosphoric ester compounds. Preferred are silane coupling agents [e.g. vinyl-tris-(β-methoxyethoxy)silane, N-β-(aminoethyl)-γ-amino-propylmethyldimethoxysilane, N-β-(aminoethyl)-γ-aminopropyltrimethoxysilane, N-β-(aminoethyl)-γ-aminopropyltriethoxysilane, γ-aminopropyltrimethoxysilane, γ-aminopropyltriethoxysilane, γ-glycidoxypropyltrimethoxysilane, γ-glycidoxypropyltriethoxysilane, γ-glycidoxypropylmethyldiethoxysilane, etc.] and titanium coupling agents [e.g. dihydroxy-bis(lactado)titanium, dialkyl-bis(triethanolaminato)titanium, oxotitaniumbis(monoammonium oxalate), etc.].

When said adhesion promoter is added, its addition amount is generally not over 10 weight %, preferably 0.01 to 5 weight %, based on the weight of the polymer (A) or (A1).

There is no particular limitation on the method for preparing the composition of the present invention and, for example, it is sufficient to admix the components described hereinbefore.

As examples of application of the composition of the present invention, fabrications of a black matrix and of a phosphor screen for a color picture tube are now described.

The process for fabricating a black matrix for a color picture tube may typically comprise the following sequence:
① coat a glass panel is coated with a photosensitive composition comprising said vinyl polymer (A) or (A1) and said photosensitive compound (B) according to the invention in a thickness of, usually, 0.1 to 2.0 μm;
② the coat is dried with a hot plate, an infrared heater, a far-infrared heater, or the like to prepare a coated film;
③ using an ultra-high-pressure mercury vapor lamp, a high-pressure mercury vapor lamp, or a metal halide lamp, the film is exposed to ultraviolet light through a photomask having a desired pattern, usually at a 0.5 to 50 mJ/cm$^2$;
④ a resist pattern is formed through developing the film with water for removal of the unexposed areas;
⑤ the surface is coated with a dispersion of a black material such as graphite;
⑥ the film is dried with a hot plate, an infrared heater, a far-infrared heater or the like;
⑦ the resist pattern is decomposed by oxidation with an oxidizing agent such as hydrogen peroxide; and
⑧ the pattern is developed with water. The polymer (A) or (A1) and the photosensitive compound (B) in the photosensitive composition used in the above step ① are preferably water-soluble.

When the photosensitive composition of the present invention has a reciprocity law failing characteristic, the luminous intensity of exposure UV light is preferably within the range of 0.02 to 1.0 mW/cm$^2$.

If the luminous intensity of exposure light is less than 0.02 mW/cm$^2$, either the pattern is drastically reduced in size or no pattern will be obtained. When the intensity of exposure light exceeds 1.0 mW/cm$^2$, the exposure time for attaining a pattern of the proper size will be drastically reduced, resulting in swelling and wrinkle formation of the pattern.

On the other hand, the process for fabricating a phosphor screen for a color picture tube comprises the following sequence:
① a glass panel carrying a black matrix is coated with a photosensitive composition of the invention, comprising said vinyl polymer (A) or (A1), said photosensitive compound (B) and a phosphor suspended therein, usually in a thickness of 5 to 15 μm;
② the coat is dried with a hot plate, an infrared heater, a far-infrared heater or the like to prepare a dry film;
③ using an ultra-high-pressure mercury vapor lamp, a high-pressure mercury vapor lamp, a metal halide lamp, expose the film is exposed to ultraviolet light through a photomask having a desired pattern usually at 0.5 to 50 mJ/cm$^2$; and
④ a phosphor pattern is formed through developing the film with water to wash away the unexposed areas; said series of steps being carried out for each of the three primary phosphors of red, green and blue, and finally heating the assembly (about 400° C.) within the air to oxidize and remove the organic matter. The polymer (A) or (A1) and the photosensitive composition (B) in the above step ① are preferably water-soluble.

Where necessary, an aqueous solution containing a water-soluble polymer and a water-soluble azide compound may be applied to the glass panel to form a thin film prior to said step ①, whereby the adhesion of the phosphor can be further improved. Water-soluble polymers usable for this purpose are not particularly restricted but include, for example, polyvinylformamide or vinylformamide copolymers, polyvinylpyrrolidone or vinylpyrrolidone copolymers, poly(meth)acrylamides or (meth)acrylamide copolymers, (meth)acrylamide-diacetone(meth)acrylamide copolymers, polyvinyl alcohol or vinyl alcohol copolymers, and the like. Water-soluble azide compounds usable for the purpose are not particularly restricted, but preferred is sodium 4,4'-diazidostilbene-2,2'-disulfonate.

BEST MODE FOR CARRYING OUT THE INVENTION

The following examples are intended to illustrate the present invention in further detail and should by no means be construed as defining the scope of the present invention. In the following description, % stands for weight %.

The term "exposure" is used in the following examples to mean exposure with a given spacing (e.g. 3.0 mm) maintained between the photomask and the glass substrate, the so-called gap exposure. Furthermore, although "sensitivity" has been variously defined, the "sensitivity" referred to in the examples is the exposure time which elapses until the phosphor pattern width has reached 80% (56 $\mu$m) of the mask size when exposure is carried out through a photomask having a mask size of 70 $\mu$m at a given luminous intensity. Here, the shorter the exposure time is, the higher is the sensitivity of the composition.

SYNTHESIS EXAMPLE 1

In 1530 g of deionized water was dissolved 270.0 g of N-vinylformamide, and the solution was heated to 55° C. After adding thereto 0.25 g of VA-044 (Wako Pure Chemical Ind.) as the polymerization initiator, the mixture was stirred at 55° C. for 5 hours and then diluted with 2,060 g of deionized water to a solid concentration of 7.0%. The GPC weight average molecular weight of the resulting polymer was about 1,200,000.

EXAMPLE 1

According to the recipe shown in Table 1, the components were admixed to provide a photosensitive composition (1) of the present invention. By spin coating method, the composition (1) was coated onto a glass substrate in a thickness of 0.8 $\mu$m and dried on a hot plate at 50° C. for 1 minute to provide a coated film. Then, using an ultra-high-pressure mercury vapor lamp, the film was exposed to ultraviolet light through a photomask with a line width of 70 $\mu$m at a luminous intensity of 0.15 mW/cm$^2$. The film was developed with water at room temperature to form a resist pattern and the sensitivity was measured. The sensitivity value was 14 seconds (exposure dose 2.1 mJ/cm$^2$).

There was no post-development pattern distortion and a faithful reproduction of the mask pattern was obtained.

Furthermore, this composition showed a reciprocity characteristic.

On the whole surface of the glass substrate carrying the above pattern, a graphite dispersion, Electrodag ED-1530 (Achesen (Japan) Limited), was applied by the spin coating method in a graphite film thickness of 0.8 $\mu$m.

Then, the graphite-treated glass panel was immersed in an etching solution containing 3% hydrogen peroxide and 0.5% sulfuric acid at room temperature for 30 seconds, followed by developing with water at room temperature to provide the objective black matrix.

The black matrix thus formed showed a faithful reproduction of the mask pattern without any pattern distortion.

TABLE 1

| Aqueous solution of polymer obtained in Synthesis Example 1 (7% solids) | 100 parts by weight |
|---|---|
| Sodium 4,4'-diazidostilbene-2,2'-disulfonate | 0.7 part by weight |
| Surfactant (Nonion LT-221, NOF Corporation) | 0.04 part by weight |
| N-β-(aminoethyl)-γ-aminopropyltri-methoxysilane | 0.08 part by weight |
| Deionized water | 150 parts by weight |

SYNTHESIS EXAMPLE 2

In 1674 g of deionized water were dissolved 62.6 g of N-vinylformamide and 63.4 g of diacetoneacrylamide, and the solution was heated to 57° C. Then, 0.15 g of VA-044 (Wako Pure Chemical Ind.) was added thereto as the polymerization initiator, and the mixture was stirred at 57° C. for 5 hours. The GPC weight average molecular weight of the resulting copolymer was about 1,300,000.

EXAMPLE 2

A photosensitive composition was prepared according to the recipe shown in Table 2 and subjected to the same sequence of coating, drying, exposure and development as in Example 1 to provide a resist pattern. The sensitivity was 15 seconds (exposure dose 2.3 mJ/cm$^2$).

This composition showed a remarkable reciprocity law failing characteristic.

Furthermore, a black matrix fabricated in the same manner as in Example 1 showed a faithful reproduction of the mask pattern without any pattern distortion.

TABLE 2

| Aqueous solution of polymer obtained in Synthesis Example 2 (7% solids) | 100 parts by weight |
|---|---|
| Sodium 4,4'-diazidostilbene-2,2'-disulfonate | 0.7 part by weight |
| Surfactant (Nonion LT-221, NOF Corporation) | 0.04 part by weight |
| N-β-(aminoethyl)-γ-aminopropyltri-methoxysilane | 0.08 part by weight |
| Deionized water | 150 parts by weight |

SYNTHESIS EXAMPLE 3

In 1674 g of deionized water were dissolved 62.6 g of N-vinylformamide and 63.4 g of sodium p-styrenesulfonate, and the solution was heated to 56° C. Then, 0.15 g of VA-044 (Wako Pure Chemical Ind.) was added thereto as the polymerization initiator, and the mixture was stirred at 56° C. for 5 hours. The GPC weight average molecular weight of the resulting copolymer was about 1,200,000.

EXAMPLE 3

A photosensitive composition was prepared according to the recipe shown in Table 3 and subjected to the same sequence of coating, drying, exposure and development as in Example 1 to provide a resist pattern. The sensitivity was found to be 17 seconds (exposure dose 2.6 mJ/cm$^2$).

This composition showed a remarkable reciprocity law failing characteristic.

Furthermore, a black matrix fabricated in the same manner as in Example 1 showed a faithful reproduction of the mask pattern without any pattern distortion.

TABLE 3

| Aqueous solution of polymer obtained in Synthesis Example 3 (7% solids) | 100 parts by weight |
|---|---|
| Sodium 4,4'-diazidostilbene-2,2'-disulfonate | 0.7 part by weight |
| Surfactant (Nonion LT-221, NOF Corporation) | 0.04 part by weight |
| N-β-(aminoethyl)-γ-aminopropyltri-methoxysilane | 0.08 part by weight |
| Deionized water | 150 parts by weight |

EXAMPLE 4

A photosensitive composition was prepared according to the recipe shown in Table 4 and subjected to the same sequence of coating, drying, exposure and development as in Example 1 to provide a resist pattern. The sensitivity was found to be 17 seconds (exposure dose 2.6 mJ/cm$^2$).

This composition showed a remarkable reciprocity law failing characteristic.

Furthermore, a black matrix fabricated in the same manner as in Example 1 showed a faithful reproduction of the mask pattern without any pattern distortion.

TABLE 4

| | |
|---|---|
| Aqueous solution of polymer obtained in Synthesis Example 1 (7% solids) | 70 parts by weight |
| Polyvinylpyrrolidone, aq. sol. (7% solids (PVP K-90, International Specialty Products) | 30 parts by weight |
| Sodium 4,4'-diazidostilbene-2,2'-disulfonate | 0.7 part by weight |
| Surfactant (Nonion LT-221, NOF Corporation) | 0.04 part by weight |
| N-β-(aminoethyl)-γ-aminopropyltri-methoxysilane | 0.08 part by weight |
| Deionized water | 150 parts by weight |

SYNTHESIS EXAMPLE 4

In 1674 g of deionized water were dissolved 62.6 g of acrylamide and 63.4 g of diacetoneacrylamide, and the solution was heated to 57° C. Then, 0.2 g of VA-044 (Wako Pure Chemical Ind.) was added thereto as the polymerization initiator, and the mixture was stirred at 57° C. for 5 hours. The GPC weight average molecular weight of the resulting copolymer was about 1,400,000.

EXAMPLE 5

A photosensitive composition was prepared according to the recipe shown in Table 5 and subjected to the same sequence of coating, drying, exposure and development as in Example 1 to provide a resist pattern. The sensitivity was found to be 15 seconds (exposure dose 2.3 mJ/cm$^2$).

This composition showed a remarkable reciprocity law failing characteristic.

Furtheremore, a black matrix fabricated in the same manner as in Example 1 showed a faithful reproduction of the mask pattern without any pattern distortion.

TABLE 5

| | |
|---|---|
| Aqueous solution of polymer obtained in Synthesis Example 1 (7% solids) | 70 parts by weight |
| Aqueous solution of copolymer obtained in Synthesis Example 4 (7% solids) | 30 parts by weight |
| Sodium 4,4'-diazidostilbene-2,2'-disulfonate | 0.7 part by weight |
| Surfactant (Nonion LT-221, NOF Corporation) | 0.04 part by weight |
| N-β-(aminoethyl)-γ-aminopropyltri-methoxysilane | 0.08 part by weight |
| Deionized water | 150 parts by weight |

EXAMPLE 6

A photosensitive composition was prepared according to the recipe shown in Table 6 and subjected to the same sequence of coating, drying, exposure and development as in Example 1 to provide a resist pattern. The sensitivity was found to be 14 seconds (exposure dose 2.1 mJ/cm$^2$).

This composition showed a remarkable reciprocity law failing characteristic.

Furthermore, a black matrix fabricated in the same manner as in Example 1 showed a faithful reproduction of the mask pattern without any pattern distortion.

TABLE 6

| | |
|---|---|
| Aqueous solution of copolymer obtained in Synthesis Example 2 (7% solids) | 100 parts by weight |
| Sodium 4,4'-diazidostilbene-2,2'-disulfonate | 0.7 part by weight |
| Tetramethylammonium iodide | 0.3 part by weight |
| Surfactant (Nonion LT-221, NOF Corporation) | 0.04 part by weight |
| N-β-(aminoethyl)-γ-aminopropyltri-methoxysilane | 0.08 part by weight |
| Deionized water | 150 parts by weight |

EXAMPLE 7

Except that sorbitol was used in lieu of tetramethylammonium iodide, a photosensitive composition was prepared according to the same recipe as in Example 6 and subjected to the same sequence of coating, drying, exposure and development as in Example 1 to provide a resist pattern. The sensitivity was found to be 14 seconds (exposure dose 2.1 mJ/cm$^2$).

This composition showed a remarkable reciprocity law failing characteristic.

Furthermore, a black matrix fabricated in the same manner as in Example 1 showed a faithful reproduction of the mask pattern without any pattern distortion.

EXAMPLE 8

A photosensitive composition was prepared according to the recipe shown in Table 7 and subjected to the same sequence of coating, drying, exposure and development as in Example 1 to provide a resist pattern. The sensitivity measured was 14 seconds (exposure dose 2.1 mJ/cm$^2$).

This composition showed a remarkable reciprocity law failing characteristic.

Then, a black matrix fabricated in the same manner as in Example 1 showed a faithful reproduction of the mask pattern without any pattern distortion.

TABLE 7

| | |
|---|---|
| Aqueous solution of copolymer obtained in Synthesis Example 2 (7% solids) | 70 parts by weight |
| Polyvinyl alcohol, aq. sol. (10% solids) (Denka Poval K-05, Denki Kagaku Kogyo) | 3 parts by weight |
| Sodium 4,4'-diazidostilbene-2,2'-disulfonate | 0.7 part by weight |
| Surfactant (Nonion LT-221, NOF Corporation) | 0.04 part by weight |
| N-β-(aminoethyl)-γ-aminopropyltri-methoxysilane | 0.08 part by weight |
| Deionized water | 147 parts by weight |

SYNTHESIS EXAMPLE 5

To 500 g of the aqueous solution of polymer (7% solids) obtained in Synthesis Example 1 was added 60 g of 20% aqueous solution of sodium hydroxide, and the mixture was stirred at 75° C. for 7 hours. After spontaneous cooling, the reaction mixture was precipitated with methanol, and 20 g of the resulting solid was dried and redissolved in 266 g of deionized water, to obtain a polymer comprising vinylamine and vinylformamide as monomer units with a hydrolysis rate of 60%. The GPC weight average molecular weight of this polymer was about 1,200,000.

EXAMPLE 9

A photosensitive composition was prepared according to the recipe shown in Table 8 and subjected to the same sequence of coating, drying, exposure and development as in Example 1 to provide a resist pattern. The sensitivity measured was 11 seconds (exposure dose 1.7 mJ/cm$^2$).

This composition showed a reciprocity characteristic.

Then, a black matrix fabricated in the same manner as in Example 1 showed a faithful reproduction of the mask pattern without any pattern distortion.

TABLE 8

| | |
|---|---|
| Aqueous solution of polymer obtained in Synthesis Example 5 (7% solids) | 100 parts by weight |
| Sodium 4,4'-diazidostilbene-2,2'-disulfonate | 0.7 part by weight |
| Surfactant (Nonion LT-221, NOF Corporation) | 0.04 part by weight |
| N-β-(aminoethyl)-γ-aminopropyltri-methoxysilane | 0.08 part by weight |
| Deionized water | 150 parts by weight |

SYNTHESIS EXAMPLE 6

In a solvent mixture of deionized water (300 g) and ethanol (100 g) was dissolved 30 g of the polymer obtained in Synthesis Example 5. After addition of 100 g of methyl iodide, the mixture was stirred at 70 for 10 hours. After spontaneous cooling, the reaction mixture was precipitated with methanol, and 20 g of the resulting solid was dried and redissolved in 266 g of deionized water, to obtain a polymer comprising vinylmethylamine, vinylamine and vinylformamide as monomer units with 50% methylation of vinylamine. The GPC weight average molecular weight of this polymer was about 1,200,000.

EXAMPLE 10

A photosensitive composition was prepared according to the recipe shown in Table 9 and subjected to the same sequence of coating, drying, exposure and development as in Example 1 to provide a resist pattern. The sensitivity measured was 12 seconds (exposure dose 1.8 mJ/cm$^2$).

This composition showed a reciprocity characteristic.

Then, a black matrix fabricated in the same manner as in Example 1 showed a faithful reproduction of the mask pattern without any pattern distortion.

TABLE 9

| | |
|---|---|
| Aqueous solution of polymer obtained in Synthesis Example 6 (7% solids) | 100 parts by weight |
| Sodium 4,4'-diazidostilbene-2,2'-disulfonate | 0.7 part by weight |
| Surfactant (Nonion LT-221, NOF Corporation) | 0.04 part by weight |
| N-β-(aminoethyl)-γ-aminopropyltri-methoxysilane | 0.08 part by weight |
| Deionized water | 150 parts by weight |

EXAMPLE 11

According to the recipe shown in Table 10, the components were admixed to provide a phosphor-containing photosensitive composition (2) of the present invention. This composition (2) was coated onto a glass substrate in a thickness of 10 μm by the spin coating method and dried on a hot plate at 50° C. for 1 minute to provide a coated film. The film showed no unevenness. Using an ultra-high-pressure mercury vapor lamp, the film was exposed to ultraviolet light through a photomask at a luminous intensity of 0.40 mW/cm$^2$ and then developed with water at room temperature to prepare a phosphor pattern. The sensitivity measured was 8 seconds (exposure dose 3.2 mJ/cm$^2$).

There was no post-development pattern distortion and a faithful reproduction of the mask pattern was confirmed.

TABLE 10

| | |
|---|---|
| Aqueous solution of polymer obtained in Synthesis Example 1 (7% solids) | 43 parts by weight |
| Sodium 4,4'-diazidostilbene-2,2'-disulfonate | 0.3 part by weight |
| Blue phosphor (ZnS:Ag) | 50 parts by weight |
| Dispersant (Carryibon L-400, Sanyo Chemical Industries) | 0.06 part by weight |
| Surfactant (Nonion LT-221, NOF Corporation) | 0.03 part by weight |
| N-β-(aminoethyl)-γ-aminopropyltri-methoxysilane | 0.01 part by weight |
| Deionized water | 87 parts by weight |

SYNTHESIS EXAMPLE 7

A stirring autoclave was charged with triethylamine (1 mole), dimethyl carbonate (1.5 moles) and methanol as a solvent (2.0 moles) and the reaction was carried out at 110° C. for 12 hours to prepare a methanolic solution of triethylmethylammonium carbonate.

To a 40% solution of an acrylic acid-methyl methacrylate copolymer (molar ratio 70/30) in isopropyl alcohol was added the above methanolic solution of triethylmethylammonium carbonate in a stoichiometric ratio of 70 mole % per mole of COOH.

Then, byproduct carbon dioxide gas and the methanol were removed to provide a 40% solution of a triethylmethyl ammonium salt of the acrylic acid-methyl methacrylate copolymer. The GPC average molecular weight of the resulting copolymer was about 10,000.

EXAMPLE 12

A phosphor-containing photosensitive composition was prepared according to the recipe shown in Table 11 and subjected to the same sequence of coating, drying, exposure and development as in Example 11 to provide a phosphor pattern. The sensitivity measured was 8 seconds (exposure dose 3.2 mJ/cm$^2$).

There was no post-development pattern distortion and a faithful reproduction of the mask pattern was confirmed.

TABLE 11

| | |
|---|---|
| Aqueous solution of polymer obtained in Synthesis Example 1 (7% solids) | 43 parts by weight |
| Sodium 4,4'-diazidostilbene-2,2'-disulfonate | 0.3 part by weight |
| Blue phosphor (ZnS:Ag) | 50 parts by weight |
| Dispersant obtained in Synthesis Example 7 (40% solids) | 0.06 part by weight |
| Surfactant (Nonion LT-221, NOF Corporation) | 0.03 part by weight |

TABLE 11-continued

| | |
|---|---|
| N-β-(aminoethyl)-γ-aminopropylitri-methoxysilane | 0.01 part by weight |
| Deionized water | 87 parts by weight |

EXAMPLE 13

A phosphor-containing photosensitive composition was prepared according to the recipe shown in Table 12 and subjected to the same sequence of coating, drying, exposure and development as in Example 11 to provide a phosphor pattern. The sensitivity was found to be 8 seconds (exposure dose 3.2 mJ/cm$^2$).

There was no post-development pattern distortion and a faithful reproduction of the mask pattern was confirmed.

TABLE 12

| | |
|---|---|
| Aqueous solution of polymer obtained in Synthesis Example 1 (7% solids) | 43 parts by weight |
| Sodium 4,4'-diazidostilbene-2,2'-disulfonate | 0.3 part by weight |
| Blue phosphor (ZnS:Ag) | 50 parts by weight |
| Dispersant (Newpol PE-61, Sanyo Chemical Industries) | 0.06 part by weight |
| Surfactant (Nonion LT-221, NOF Corporation) | 0.03 part by weight |
| N-β-(aminoethyl)-γ-aminopropylitri-methoxysilane | 0.01 part by weight |
| Deionized water | 87 parts by weight |

EXAMPLE 14

A phosphor-containing photosensitive composition was prepared according to the recipe shown in Table 13 and subjected to the same sequence of coating, drying, exposure and development as in Example 11 to provide a phosphor pattern. The sensitivity was found to be 8 seconds (exposure dose 3.2 mJ/cm$^2$).

There was no post-development pattern distortion and a faithful reproduction of the mask pattern was confirmed.

TABLE 13

| | |
|---|---|
| Aqueous solution of polymer obtained in Synthesis Example 1 (7% solids) | 43 parts by weight |
| Sodium 4,4'-diazidostilbene-2,2'-disulfonate | 0.3 part by weight |
| Blue phosphor (ZnS:Ag) | 50 parts by weight |
| Dispersant (Carrybon L-400, Sanyo Chemical Industries) | 0.06 part by weight |
| Surfactant (Nonion LT-221, NOF Corporation) | 0.03 part by weight |
| Dihydroxy-bis(lactado)titanium | 0.01 part by weight |
| Deionized water | 87 parts by weight |

EXAMPLE 15

A phosphor-containing photosensitive composition was prepared according to the recipe shown in Table 14 and subjected to the same sequence of coating, drying, exposure and development as in Example 11 to provide a phosphor pattern. The sensitivity was found to be 10 seconds (exposure dose 4.0 mJ/cm$^2$).

There was no post-development pattern distortion and a faithful reproduction of the mask pattern was confirmed.

TABLE 14

| | |
|---|---|
| Aqueous solution of copolymer obtained in Synthesis Example 2 (7% solids) | 43 parts by weight |
| Sodium 4,4'-diazidostilbene-2,2'-disulfonate | 0.3 part by weight |
| Blue phosphor (ZnS:Ag) | 50 parts by weight |
| Dispersant (Carrybon L-400, Sanyo Chemical Industries) | 0.06 part by weight |
| Surfactant (Nonion LT-221, NOF Corporation) | 0.03 part by weight |
| N-β-(aminoethyl)-γ-aminopropyltri-methoxysilane | 0.01 part by weight |
| Deionized water | 87 parts by weight |

SYNTHESIS EXAMPLE 8

In 425 g of deionized water were dissolved 25.0 g of N-vinylformamide and 50.0 g of 50% aqueous solution of acrylamide, followed by heating them to 56° C. After addition of 0.05 g of VA-044 [Wako Pure Chemical Ind.] as the polymerization initiator, the mixture was stirred at 56° C. for 5 hours and then diluted with 214 g of deionized water to make a solid concentration of 7%. The GPC weight average molecular weight of the resulting copolymer was about 1,200,000.

EXAMPLE 16

A phosphor-containing photosensitive composition was prepared according to the recipe shown in Table 15 and subjected to the same sequence of coating, drying, exposure and development as in Example 11 to provide a phosphor pattern. The sensitivity was found to be 12 seconds (exposure dose 4.8 mJ/cm$^2$).

There was no post-development pattern distortion and a faithful reproduction of the mask pattern was confirmed.

TABLE 15

| | |
|---|---|
| Aqueous solution of copolymer obtained in Synthesis Example 8 (7% solids) | 43 parts by weight |
| Sodium 4,4'-diazidostilbene-2,2'-disulfonate | 0.3 part by weight |
| Blue phosphor (ZnS:Ag) | 50 parts by weight |
| Dispersant (Carrybon L-400, Sanyo Chemical Industries) | 0.06 part by weight |
| Surfactant (Nonion LT-221, NOF Corporation) | 0.03 part by weight |
| N-β-(aminoethyl)-γ-aminopropyltri-methoxysilane | 0.01 part by weight |
| Deionized water | 87 parts by weight |

COMPARATIVE EXAMPLE 1

A control photosensitive composition was prepared according to the recipe shown in Table 16 and subjected to the same sequence of coating, drying, exposure and development as in Example 1 to provide a phosphor pattern. The sensitivity was found to be 35 seconds (exposure dose 5.3 mJ/cm$^2$).

This composition showed a reciprocity law failing characteristic.

TABLE 16

| | |
|---|---|
| Polyvinylpyrrolidone, aq. sol. (7% solids) (PVP K-90, International Specialty Products) | 100 parts by weight |
| Sodium 4,4'-diazidostilbene-2,2'-disulfonate | 0.7 part by weight |

TABLE 16-continued

| | |
|---|---|
| Surfactant (Nonion LT-221, NOF Corporation) | 0.04 part by weight |
| N-β-(aminoethyl)-γ-aminopropyltri-methoxysilane | 0.08 part by weight |
| Deionized water | 150 parts by weight |

COMPARATIVE EXAMPLE 2

A control photosensitive composition was prepared according to the recipe shown in Table 17 and subjected to the same sequence of coating, drying, exposure and development as in Example 1 to provide a resist pattern. The sensitivity was found to be 24 seconds (exposure dose 3.6 mJ/cm$^2$).

This composition showed a reciprocity law failing characteristic.

TABLE 17

| | |
|---|---|
| Aqueous solution of copolymer obtained in Synthesis Example 4 (7% solids) | 100 parts by weight |
| Sodium 4,4'-diazidostilbene-2,2'-disulfonate | 0.7 part by weight |
| Surfactant (Nonion LT-221, NOF Corporation) | 0.04 part by weight |
| N-β-(aminoethyl)-γ-aminopropyltri-methoxysilane | 0.08 part by weight |
| Deionized water | 150 parts by weight |

COMPARATIVE EXAMPLE 3

A control phosphor-containing photosensitive composition was prepared according to the recipe shown in Table 18 and subjected to the same sequence of coating, drying, exposure and development as in Example 11 to provide a phosphor pattern. The sensitivity was found to be 16 seconds (exposure dose 6.4 mJ/cm$^2$).

TABLE 18

| | |
|---|---|
| Polyvinyl alcohol, aq. sol. (10% solids) (Denka Poval K-05, Denki Kagaku Kogyo) | 30 parts by weight |
| Ammonium dichromate | 0.3 part by weight |
| Blue phosphor (ZnS:Ag) | 50 parts by weight |
| Dispersant (Carrybon L-400, Sanyo Chemical Industries) | 0.06 part by weight |
| Surfactant (Nonion LT-221, NOF Corporation) | 0.03 part by weight |
| N-β-(aminoethyl)-γ-aminopropyltri-methoxysilane | 0.01 part by weight |
| Deionized water | 100 parts by weight |

COMPARATIVE EXAMPLE 4

A control phosphor-containing photosensitive composition was prepared according to the recipe shown in Table 19 and subjected to the same sequence of coating, drying, exposure and development as in Example 11 to provide a phosphor pattern. The sensitivity was found to be 25 seconds (exposure dose 10.0 mJ/cm$^2$).

TABLE 19

| | |
|---|---|
| Polyvinylpyrrolidone, aq. sol. (7% solids) (PVP K-90, International Specialty Products) | 43 parts by weight |
| Sodium 4,4'-diazidostilbene-2,2'-disulfonate | 0.3 part by weight |
| Blue phosphor (ZnS:Ag) | 50 parts by weight |
| Dispersant (Carrybon L-400, Sanyo Chemical Industries) | 0.06 part by weight |

TABLE 19-continued

| | |
|---|---|
| Surfactant (Nonion LT-221, NOF Corporation) | 0.03 part by weight |
| N-β-(aminoethyl)-γ-aminopropyltri-methoxysilane | 0.01 part by weight |
| Deionized water | 87 parts by weight |

COMPARATIVE EXAMPLE 5

A control phosphor-containing photosensitive composition was prepared according to the recipe shown in Table 20 and subjected to the same sequence of coating, drying, exposure and development as in Example 11 to provide a phosphor pattern. The sensitivity was found to be 20 seconds (exposure dose 8.0 mJ/cm$^2$).

TABLE 20

| | |
|---|---|
| Polyacrylamide, aq. sol. (7% solids) (Tokyo Kasei Kogyo Co., LTD.) | 43 parts by weight |
| Sodium 4,4'-diazidostilbene-2,2'-disulfonate | 0.3 part by weight |
| Blue phosphor (ZnS:Ag) | 50 parts by weight |
| Dispersant (Carrybon L-400, Sanyo Chemical Industries) | 0.06 part by weight |
| Surfactant (Nonion LT-221, NOF Corporation) | 0.03 part by weight |
| N-β-(aminoethyl)-γ-aminopropyltri-methoxysilane | 0.01 part by weight |
| Deionized water | 87 parts by weight |

INDUSTRIAL APPLICABILITY

The photosensitive composition of the present invention accomplishes the following results.

1) Having exceptionally high sensitivity, the photosensitive composition of the invention contributes greatly to reductions in process time and number of UV exposure units required and, hence, to improvements in productivity and production costs.

2) Because the composition is free from any noxious chromium compound, the equipment for removing chromium from the waste water can be dispensed with and yet the possible pollution be averted.

3) The invention can be applied to both an aqueous system and an organic solvent system and offers a broad choice of the diluent.

4) When the vinyl polymer contained in the photosensitive composition of the present invention is a copolymer with a defined other water-soluble vinyl monomer or a blend with a defined other water-soluble polymer, the photosensitive composition of the present invention has a reciprocity law failing characteristic. Therefore, when this photosensitive composition is used in the fabrication of a black matrix for a color picture tube, a black matrix of good contrast can be obtained, thus enabling manufacture of a high-resolution, high-quality color picture tube.

5) In case the phosphor-containing photosensitive composition of the invention is applied to the fabrication of a phosphor screen for a color picture tube, because the composition containing no chromium compound is capable of precluding troubles associated with residual chromium, such as coloration of the phosphor screen and the decrease in luminance of the color picture tube arising from the interference with the emission of the phosphors. Therefore, color picture tubes of exceptionally high quality and high performance can be manufactured.

6) When the photosensitive composition of the invention is applied to the fabrication of a phosphor screen for a color picture tube, it insures an outstandingly high aging stability and a high resistance to degradation due to dark reaction as compared with the conventional phosphor-containing photosensitive compositions so that the product has a long shelf-life.

7) The phosphor-containing photosensitive composition of the present invention finds application not only in the fabrication of phosphor screens for color picture tubes but also in forming phosphor screens for plasma displays, vacuum fluorescent tubes, field emission displays and other image display devices. Thus, it is of great use as photosensitive materials for phosphor screens.

8) The fine powder-containing photosensitive composition of the present invention can be used for microprocessing with microfine metal powders as well.

9) Since the photosensitive composition of the invention has exceptionally high sensitivity and high resolution characteristics, it can be used not only in the fabrication of black matrices and phosphor screens for color picture tubes but also in such applications as the shadow mask etching resist, color filter black matrix resist, color filter pigment dispersion resist, printed circuit board solder resist, printed circuit board etching resist, printed circuit board dry film resist, interlayer insulating material, liquid crystal transparent electroconductive film (Indium Tin Oxide (ITO)) patterning resist, photosensitive printing plates, printing ink, and photocurable coating materials, among others.

What is claimed is:

1. A photosensitive composition, which comprises 70 to 99% by weight of a vinyl polymer (A) and 1 to 30% by weight of at least one photosensitive compound (B) selected from the group consisting of azide compounds and diazo compounds; said polymer (A) comprising recurring units derived from a monomer (a) of the general formula:

$$H_2C=CH-X-Q \quad (1)$$

wherein Q is a functional group having a frontier electron density of not less than 0.067 in accordance with the equation:

Frontier electron density=2×(Atomic orbital coefficient in lowest unoccupied molecular orbital )² and is selected from the group consisting of —NH—R, —COCH$_2$COCH$_3$ and —SO$_2$NH$_2$, R represents H or a group selected from the group consisting of —CHO, —NH$_2$, —N(CH$_3$)$_2$, -COOH, —CONH$_2$, —CONHCH$_3$, alkyl group containing 1 to 6 carbon atoms and alkyl groups containing 1 to 6 carbon atoms and having a hydroxyl, ether, amino, nitro, cyano, carbonyl, carboxyl, amide, or urea group; and X is selected from the group consisting of direct bond, 1,4-phenylene, sulfonyl, methylene and alkylene groups containing 2 to 5 carbon atoms, the methylene and alkylene groups having or not having an ether, carbonyl, carboxyl, amide or urea group.

2. The photosensitive composition according to claim 1 wherein X is a direct bond.

3. The photosensitive composition according to claim 1 wherein Q is —NH—R and R is selected from the group consisting of —CHO, —H (hydrogen atom), —CH$_3$, —C$_2$H$_5$, —CH$_2$CH$_2$CH$_3$, —CH(CH$_3$)$_2$, —NH$_2$, —COOH, —CH$_2$CH$_2$OH, —CH$_2$CH$_2$NH$_2$, —CONH$_2$ and —CONHCH$_3$.

4. The photosensitive composition according to claim 3 wherein R is —CHO.

5. The photosensitive composition according to claim 1 wherein the polymer (A) is a water-soluble copolymer.

6. The photosensitive composition according to claim 1 wherein the polymer (A) is a water-soluble copolymer, derived from 20 to 99 mole % of the monomer (a) and 1 to 80 mole % of another water-soluble vinyl monomer (b).

7. The photosensitive composition according to claim 6 wherein (b) is at least one water-soluble vinyl monomer (b1) selected from the group consisting of aromatic ring-containing water-soluble monomers, heterocycle-containing water-soluble monomers and acrylic water-soluble monomers having a molecular weight of not less than 130.

8. A photosensitive composition, which comprises 70 to 99% by weight of a vinyl polymer (A1) and 1 to 30% by weight of at least one photosensitive compound (B) selected from the group consisting of azide compounds and diazo compounds; said polymer (A1) comprising recurring units derived from a monomer (a1) containing a functional group having a frontier electron density of not less than 0.067 in accordance with the equation;

Frontier electron density=2×(Atomic orbital coefficientin in lowest unoccupied molecular orbital)² and a solubility parameter of 8.6 to 11.0.

9. The photosensitive composition according to claim 8 wherein the monomer (a1) is N-vinylformamide.

10. The photosensitive composition according to claim 1 wherein the photosensitive compound (B) is a water-soluble azido compound.

11. A photosensitive composition which comprises 30 to 98% by weight of the photosensitive composition according to claim 1 and 2 to 70% by weight of at least one water-soluble polymer (C), having a weight average molecular weight of not less than 1000, selected from the group consisting of vinylpyrrolidone polymers, (meth)acrylamide-diacetone(meth)acrylamide copolymers, N,N-dimethylaminoethyl (meth)acrylate polymers, 3-sulfopropyl (meth)acrylate polymers and salts thereof, N,N-dimethylaminopropyl(meth)acrylamide polymers, 2-(meth) acrylamide-2-methylpropanesulfonic acid polymers and salts thereof, and styrenesulfonic acid polymers and salts thereof.

12. A photosensitive composition, which comprises 0.5 to 60% by weight of the photosensitive composition according to claim 1 and 40 to 99.5% by weight of at least one finely divided powder (D) selected from the group consisting of phosphor, metal oxide, metal hydroxide, metal salt and pigments.

13. The photosensitive composition according to claim 12 wherein (D) is a phosphor.

14. The photosensitive composition according to claim 12 which further comprises a dispersant (E) in an amount of 0.01 to 10% by weight based on the weight of (D).

15. A color picture tube which comprises a black matrix or a phosphor screen fabricated from the photosensitive composition according to claim 1.

16. A photosensitive composition according to claim 8 wherein the photosensitive compound (B) is a water-soluble azide compound.

17. A photosensitive composition which comprises 30 to 98% by weight of the photosensitive composition according to claim 3 and 2 to 70% by weight of at least one water-soluble polymer (C), having a weight average molecular weight of not less than 1000, selected from the group consisting of vinylpyrrolidone polymers, (meth)acrylamide-diacetone(meth)acrylamide copolymers, N,N-dimethylaminoethyl (meth)acrylate polymers, 3-sulfopropyl (meth)acrylate polymer salts thereof, N,N-dimethylaminopropyl(meth)acrylamide polymers, 2-(meth)

acrylamide-2-methylpropanesulfonic acid polymers and salts thereof, and styrenesulfonic acid polymers and salts thereof.

18. A photosensitive composition, which comprises 0.5 to 60% by weight of the photosensitive composition according to claim 8 and 40 to 99.5% by weight of at least one finely divided powder (D) selected from the group consisting of phosphors, metal oxides, metal hydroxides, metal salts and pigments; with or without a dispersant (E) in an amount of up to 10% based on the weight of said (D).

19. A photosensitive composition according to claim 18 wherein (D) is a phosphor.

20. A color picture tube which comprises a black matrix or a phosphor screen fabricated from the photosensitive composition according to claim 8.

* * * * *